US010456851B2

(12) United States Patent
Borneman et al.

(10) Patent No.: US 10,456,851 B2
(45) Date of Patent: Oct. 29, 2019

(54) WELDING SYSTEM WITH POTTED CIRCUIT BOARD AND METHOD OF MAKING THEREOF

(71) Applicant: Illinois Tool Works Inc., Glenview, IL (US)

(72) Inventors: Brian J. Borneman, Appleton, WI (US); Andrew J Henry, Appleton, WI (US)

(73) Assignee: Illinois Tool Works Inc., Glenview, IL (US)

( * ) Notice: Subject to any disclaimer, the term of this patent is extended or adjusted under 35 U.S.C. 154(b) by 1076 days.

(21) Appl. No.: 14/802,351

(22) Filed: Jul. 17, 2015

(65) Prior Publication Data

US 2017/0014934 A1  Jan. 19, 2017

(51) Int. Cl.
| | | |
|---|---|---|
| *B23K 9/10* | (2006.01) | |
| *B23K 9/32* | (2006.01) | |
| *H05K 3/28* | (2006.01) | |
| *H05K 7/14* | (2006.01) | |
| *H05K 7/20* | (2006.01) | |
| *B23K 9/16* | (2006.01) | |

(52) U.S. Cl.
CPC .............. *B23K 9/1043* (2013.01); *B23K 9/16* (2013.01); *B23K 9/32* (2013.01); *H05K 3/284* (2013.01); *H05K 7/1432* (2013.01); *H05K 7/20918* (2013.01); *H05K 2201/09972* (2013.01); *H05K 2201/2018* (2013.01); *H05K 2203/1316* (2013.01)

(58) Field of Classification Search
CPC ...... B23K 9/1043; B23K 9/32; B23K 9/1006; B23K 9/1075; B23K 9/10; H05K 1/0203; H05K 1/18; H05K 1/00; H05K 1/0201; H05K 3/284; H05K 3/301; H05K 3/28; H05K 3/282; H05K 7/1432; H05K 7/20918; H05K 7/1422; H05K 7/20909; H05K 2201/09972; H05K 2201/2018; H05K 2203/1316
USPC ......... 219/130.1, 136, 130.21, 130.33, 130.5
See application file for complete search history.

(56) References Cited

U.S. PATENT DOCUMENTS

| | | | |
|---|---|---|---|
| 5,642,260 A | 6/1997 | Sigl | |
| 5,831,240 A * | 11/1998 | Katooka | B23K 9/323 219/130.1 |
| 6,115,273 A | 9/2000 | Geissler | |

(Continued)

FOREIGN PATENT DOCUMENTS

| | | |
|---|---|---|
| DE | 10 2009 016762 A1 | 10/2010 |
| DE | 10 2010 038294 A1 | 1/2012 |
| DE | 102010038294 A1 * | 1/2012 ............. H05K 3/284 |

OTHER PUBLICATIONS

Extended European Search Report, dated Dec. 22, 2016, European Patent Office, 80298 Munich Germany.

(Continued)

*Primary Examiner* — Tu B Hoang
*Assistant Examiner* — Alba T Rosario-Aponte
(74) *Attorney, Agent, or Firm* — George R. Corrigan

(57) ABSTRACT

A method and apparatus for providing welding type power is disclosed. At least one circuit board is used that is partially potted using a potting barrier affixed to the circuit board. The partially potted portion can be inside an enclosed air flow space.

14 Claims, 3 Drawing Sheets

(56) References Cited

U.S. PATENT DOCUMENTS

| | | | |
|---|---|---|---|
| 6,329,636 B1 * | 12/2001 | Geissler | B23K 9/1006 219/130.1 |
| 6,831,838 B1 * | 12/2004 | Boyce | B23K 9/32 174/16.1 |
| 6,888,099 B1 | 5/2005 | Schneider | |
| 6,987,242 B2 | 1/2006 | Geissler | |
| 2009/0057285 A1 * | 3/2009 | Bashore | B23K 9/32 219/130.1 |
| 2009/0159571 A1 * | 6/2009 | Salsich | B23K 10/00 219/121.36 |
| 2009/0160573 A1 * | 6/2009 | Salsich | B23K 10/006 333/25 |
| 2009/0230941 A1 | 9/2009 | Vogel | |
| 2014/0374394 A1 | 12/2014 | Sigl | |

OTHER PUBLICATIONS

Miller Dynasty 280 Maxstar 280 Owner's Manual, OM-253 086H, Nov. 2013, Miller Electric Mfg. Co., Appleton, WI.

Miller Dynasty 280 Maxstar 280 Owner's Manual, OM-253 086H, Apr. 2015, Miller Electric Mfg. Co., Appleton, WI.

\* cited by examiner

WELDING SYSTEM WITH POTTED CIRCUIT BOARD AND METHOD OF MAKING THEREOF

FIELD OF THE INVENTION

The present disclosure relates generally to the art of welding type systems. More specifically, it relates to welding type systems with printed circuit boards.

BACKGROUND OF THE INVENTION

Welding type systems receive input power and provide welding type power. Welding-type system, as used herein, refers to any device capable of supplying welding type power, including ancillary devices such as a wire feeder, robot, etc. Welding type power, as used herein, refers to welding, plasma cutting or induction heating power.

Modern welding type systems includes power circuits and control circuits. Some components, particularly power components, need to be cooled. Such components are typically cooled using a fan blowing air across the component. Other components do not need cooling, and can have increased risk of failure if air is blown across them (particularly when the air is from a dusty or dirty environment, which is common where welding type systems are used). Thus, it is desirable to have some components subject to air flow, and others not subject to air flow.

Prior art welding type systems addressed the different air flow needs using an enclosed air flow space within the system housing. U.S. Pat. No. 5,642,260 (hereby incorporated by reference), issued to Sigl, and assigned to the owner of this invention, describes the first welding type system enclosed air flow space. U.S. Pat. No. 6,888,099, also incorporated by reference, describes another enclosed air flow space. These were commercialized and called the Miller® Wind Tunnel. Enclosed air flow space, as used herein, refers to a space within a welding power supply which provides air flow to components needing cooling, such as, for example, a Miller® Wind Tunnel. The Miller® Wind Tunnel provided for components that need cooling to be in the enclosed air flow space or windtunnel, and components that do not need cooling to be outside of the enclosed air flow space.

Printed circuit boards are potted to allow for more closely spaced components while maintaining a level of isolation between components. The potting also creates an environmental seal around these components, which reduces the likelihood of damage from dirt and debris when subject to air flow. One method of potting circuit cards is to place the entire assembly in a shell or cup and pot the entire assembly up to a specified level. Due to the cost of the potting compound, this can become expensive as the circuit card size increases.

Selective potting allows for a better use of potting compound, reducing cost and weight. Some circuit board assemblies require different environmental protection in different areas. For example, some components that need cooling are mounted on printed circuit boards with components that should avoid air flow. Prior art, such as the Miller® Dynasty® 280 Cooler Power Supply provided that portions of a circuit board in the wind tunnel were encapsulated in potting compound. The components that should avoid air flow are in the encapsulated region.

Many welding type systems have components with heatsinks, and only the portion of the boards with the heatsinks need to be exposed to the forced air flow. Also only the power section has high voltage components exposed that require extra protection. A significant portion of the board is less sensitive, low voltage control circuitry.

One prior art machine used a 5-sided cup that was molded and thru-hole components could be individually or group pre-potted in the cup. This reduced the amount of potting compound used, but is limited to thru-hole components. Also, the cup needs to be specific to the part that is being put in it since holes would need to be co-located with the pins of the component and sealed individually. This prior art had the potting compound poured into the cup, and not onto the board. When set, the potting compound was in the cup, and not on the board. This method did not allow flexibility in the location of components.

Another prior method uses dam-and-fill techniques to selectively pot components. The dam is formed by a high viscosity fluid and filled with a lower viscosity fluid. However, this method is limited in the depth of potting that can be achieved. This limitation is essentially the bead height of the damming material.

Another prior art technique is to use a potting tray. This requires the entire circuit card to be potted since it is placed in the shell. This can be costly and use more potting compound than necessary.

Another prior art technique is to pot the entire tray, except for the location of components that should not be potter, where voids were created with no potting compound. Each component that was not potted need a cap over it during potting to create the void. This wastes potting compound, since some areas that do not need potting were still potted, and was time consuming, since each component location that was not potted needed a cap.

Accordingly, a method of potting a circuit board in a welding type system that does not unnecessarily use potting compound, and is not time wasting, is desired.

SUMMARY OF THE PRESENT INVENTION

According to a first aspect of the disclosure a welding-type system includes an input circuit, a power circuit, and a controller. The input circuit receives input power and provides intermediate power. The power circuit has a control input and at least one switch responsive to the control input. The power circuit is also disposed to receive the intermediate power and provide welding type output power. The controller has a set point input and a control output, and the control output is connected to the control input of the power circuit. A first subset of components from of the power circuit and/or the input circuit and/or the controller are disposed on a first circuit board. The power circuit further includes a second subset of components. A potting barrier is affixed to the first circuit board, and the first subset of components are mounted on the circuit board within the potting barrier. Potting compound is within the potting barrier and on the circuit board.

According to a second aspect of the disclosure a partially potted circuit board for use in a welding-type system includes a circuit board, with a plurality of components mounted to the circuit board. The plurality of components includes a first subset of components and a second subset of components. A potting barrier is affixed to the first circuit board, and the first subset of components are mounted on the circuit board within the potting barrier. A potting compound is disposed within the potting barrier and is on the circuit board.

According to a third aspect of the disclosure a method of making a welding-type system includes mounting a first plurality of components that at least partially form an input circuit on at least one circuit board. Also, a second plurality of components that form at least a part of a power circuit are mounted on the at least one circuit board. A third plurality of components that at least partially form a controller are also mounted on the at least one circuit board. A potting barrier is affixed to the at least one circuit board. A first subset of components from at least one of the first, second and third plurality of components are mounted on the at least one circuit board and within the potting barrier. Potting compound is poured onto the at least one circuit board within the potting barrier.

The potting barrier is affixed to the circuit board using mechanical fasteners and/or adhesives in various embodiments.

The potting barrier is a rigid structure when affixed to the circuit board in one embodiment.

The second subset of components are at least partially mounted on the first circuit board outside of the potting barrier in another alternative.

The input circuit and the power circuit are disposed inside a housing, and the first circuit board is at least partially mounted inside an enclosed air flow space within the housing, in another alternative.

The controller includes a third subset of components that are at least partially mounted outside of the enclosed airflow space in one embodiment.

The power circuit includes a converter with at least one converter switch and a converter switch heat sink, wherein the converter switch heat sink is in the first subset of components in various embodiments.

The potting barrier defines an area that is entirely potted without voids, in another alternative.

Other principal features and advantages of will become apparent to those skilled in the art upon review of the following drawings, the detailed description and the appended claims.

Figure 1:
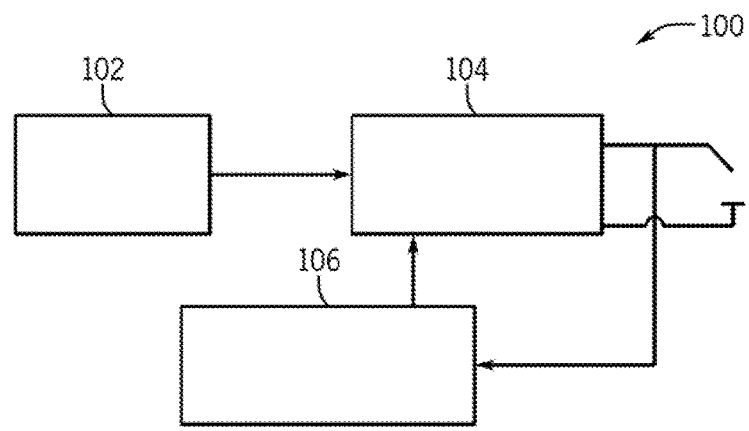
FIG. 1 is a diagram of a welding type system.

Before explaining at least one embodiment in detail it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting. Like reference numerals are used to indicate like components.

DETAILED DESCRIPTION OF THE PREFERRED EMBODIMENTS

While the present disclosure will be illustrated with reference to a particular welding type system having particular components and boards, it should be understood at the outset that the partially potted circuit board can also be implemented with other welding type system having other components and other boards.

The disclosure generally describes a welding type system with a partially potted circuit board. A welding type system 100 of the preferred embodiment is shown in FIG. 1 and includes an input circuit 102, a power circuit 104 and a controller 106. At least one of the boards used in input circuit 102, power circuit 104 and controller 106 is partially potted, as described below. The input circuit 102, power circuit 104 and controller 106 may be in accordance with the prior art, such as that shown in U.S. Pat. No. 6,987,242 (Geissler), U.S. Pat. No. 6,115,273 (Geissler) and Patent Publication 20090230941 (Vogel), all three of which are owned by the owner of this patent, and all three of which are hereby incorporated by reference.

Input circuit, as used herein, refers to circuits configured to receive input power and to provide intermediate power, and may include as part thereof components and circuits such as rectifiers, transformers, saturable reactor, converters, filters, and/or magnetic amplifiers. Power circuit, as used herein, refers to the switches and components that cooperate to process power eventually provided as output power. Controller, as used herein, refers to digital and analog circuitry, discrete or integrated circuitry, microprocessors, DSPs, etc., and software, hardware and firmware, located on one or more boards, used to control a device such as a power supply, power source or power circuit. Alternatives provide for using other welding type system designs, including additional or less circuitry or components.

Figure 2:
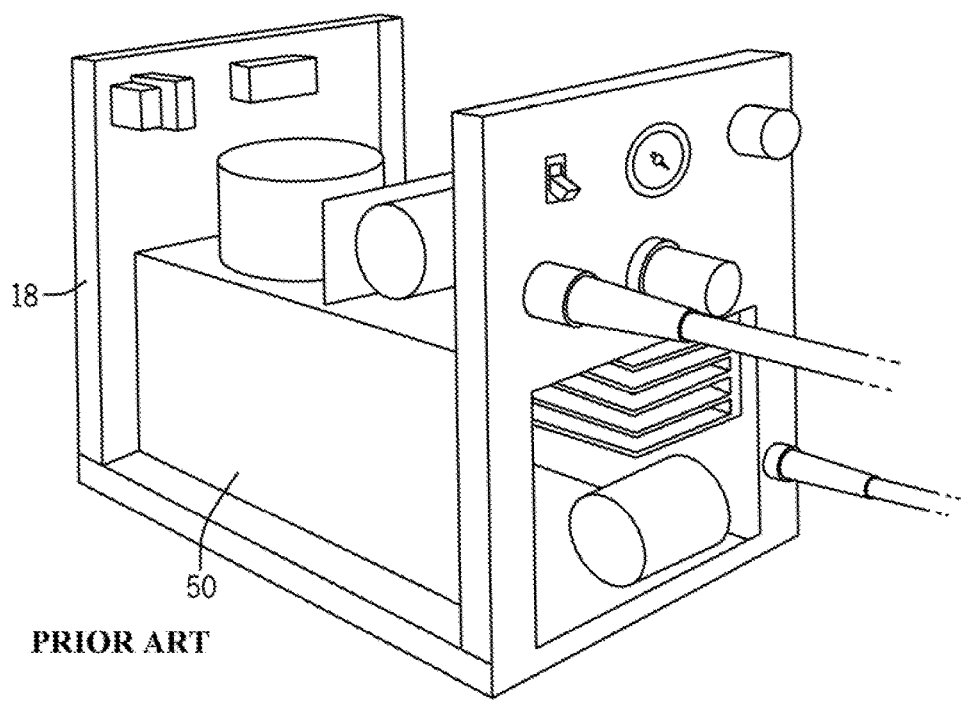
FIG. 2 is welding type system with an enclosed air flow space.

One embodiment provides welding type system 100 is implemented using an enclosed air flow space. FIG. 2 shows a housing 18 with an enclosed air space defined by walls 50. The partially potted circuit board can be mounted within enclosed air space 50. The housing 18 and enclosed air space may be in accordance with the prior art.

The partially potted circuit board is created by affixing a potting barrier to a circuit board. The potting barrier, along with the circuit board contains the potting compound when it is poured. The potting compound is poured onto the board, and when set is on the board. Potting barrier, as used herein, refers to a barrier that contains potting compound to a desired region of a circuit board by having walls extending away from the circuit board through which the potting compound cannot flow when the compound is poured onto the board as a liquid. The compound extends to and is in contact with the board. The potting barrier allows a selective, relatively deep, potting area with minimal amount of area being taken up by the molded potting barrier.

The potting barrier is, in one embodiment, affixed using an adhesive and a mechanical fastener. The adhesive can be a die cut foam adhesive or a curable liquid adhesive such as RTV. Affixed, as used herein, refers to mechanically and/or adhesively attaching. It does not include pouring a liquid onto a surface—a dam created by pouring a liquid onto a surface and then having the liquid harden is not affixed to the surface, as that term is used herein.

Preferably, the entire area within the potting barrier is potted. Entirely potting an area without voids, as used herein, refers to potting an area without caps or inserts that block a portion of the area from being potted. The potting barrier forms the vertical containment of the potting area, while the printed circuit card itself forms the horizontal or bottom containment of the potting area.

Figure 3:
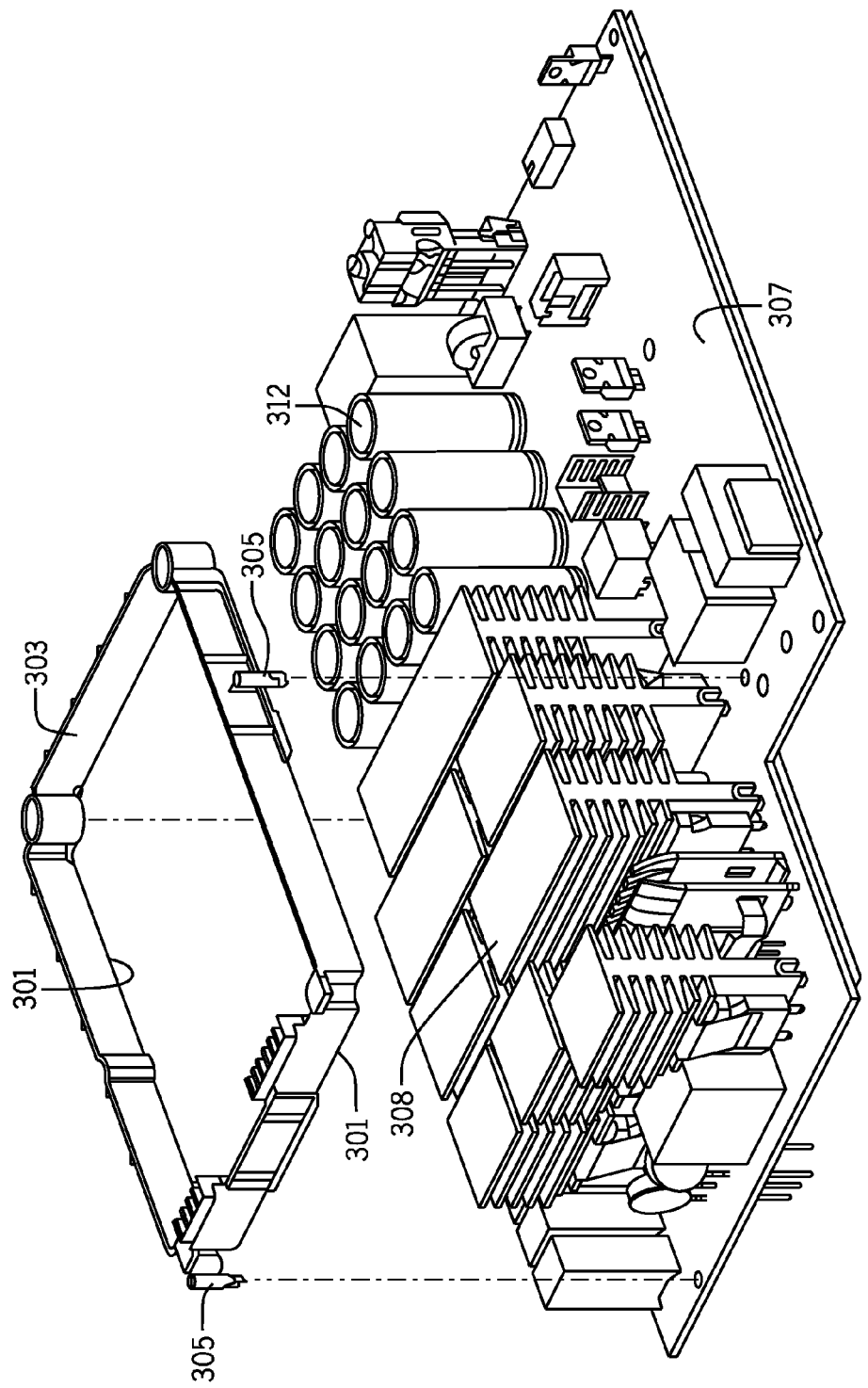
FIG. 3 is a potting barrier and a printed circuit board with components mounted thereon.

A potting barrier 303 is shown in FIG. 3, and is preferably molded. Alternatives provide for the potting barrier to be extruded, produced by additive manufacturing, or produced in other manners.

Potting barrier 303 is affixed to a circuit board 307 to enclose an area of circuit board 307 for application of a potting compound. An adhesive 301 is applied to a lower edge of potting barrier 303 (i.e., the edge that contacts board 307) to seal potting barrier 303 to circuit board 307. Potting barrier 303 includes snaps 305 which mechanically attach potting barrier 303 to circuit board 307. Snaps 305 attach to holes in circuit board 307. Alternatives provide that the snaps attach to the edge of board 307. This embodiment uses three fasteners 305. Various embodiments include the use of an adhesive and mechanical fasteners, an adhesive without mechanical fasteners, mechanical fasteners without an adhesive, multiple adhesives, multiple types of mechanical fasteners, or fewer fasteners. Alternative mechanical fasteners include using snaps mounted on board 307, screws, pins, snaps and holes, or other mechanical fasteners. A heat sink 308 is the heat sink for a switch in the power circuit, and is within the area that is potted. Other components, such as components 312 are outside the potting barrier and outside the enclosed air flow area.

Figure 4:
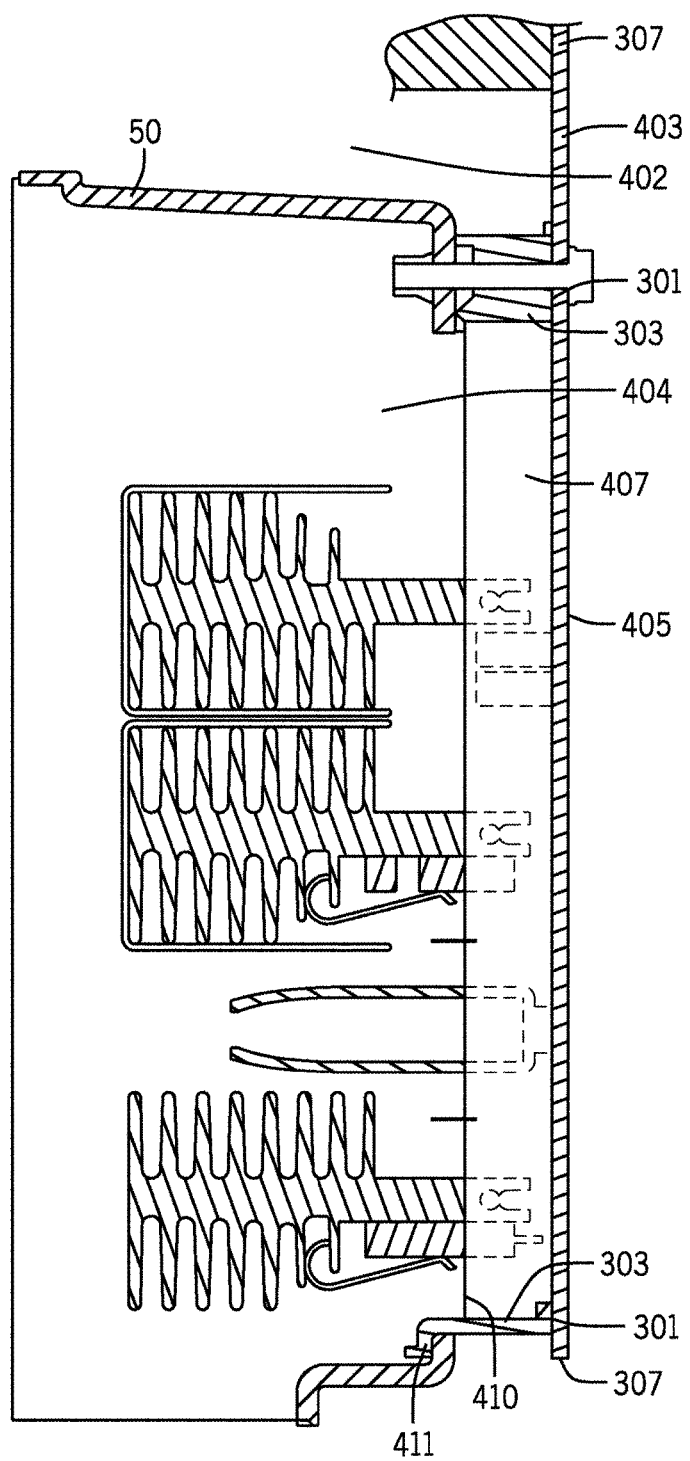
FIG. 4 is a cross sectional view of an enclosed air space, a potting barrier and a printed circuit board with components mounted thereon.

A cross section of potting barrier 303, after being mounted on board 307, and after having a potting compound 407 is cured, is shown in FIG. 4. Adhesive 301 is on the lower edges of potting barrier 303. The sides 50 of an enclosed air flow area (wind tunnel) are mounted to board 307, which defines an area 402 outside of the enclosed air flow area that corresponds to a non potted region 403 of board 307, and which define an area 404 inside the enclosed air flow area that corresponds to a potted region 405 of board 307. One embodiment provides for the entire area of circuit board 307 that is within the enclosed air flow area to be potted. In this embodiment the entire area of board 307 within the enclosed air flow area is within potting barrier 303. Another embodiment provides that only some of the area of circuit board 307 that is within the enclosed air flow area is potted and only some of the area of board 307 within the enclosed air flow area is within potting barrier 303.

The embodiment shown has a relatively high potting height 410 relative to potting barrier width as shown in FIG. 4. The potting compound is poured nearly to the top of potting barrier 303. Also, in the embodiment shown the profile 411 of the potting barrier matches the profile of the opening in the floor of the wind tunnel. Thus, the potting barrier becomes part of the wind tunnel barrier. Other embodiments provide for the potting barrier to be smaller than the wind tunnel. Also, the embodiment shown has no voids within potting barrier 303—the entire area is potted, and the potting compound is poured onto and in contact with board 305.

The finished potted PCB assembly is mounted via features in the potting barrier (screw boss and hook features) to a windtunnel (or other enclosed air flow area). The potted region of the circuit card is exposed to the environment of the windtunnel interior which contains a higher degree of contamination than the exterior of the windtunnel. The barrier thus becomes a part of the windtunnel function, as well. This allows for a more compact component spacing and higher degree of protection for the components.

The embodiment shown allows for selective potting of circuit card components yet reduces the amount (and cost) of potting material used. Various areas of a single assembly or board can be treated differently. Also, this allows for higher potting levels to be achieved than other techniques. The potting barrier can perform additional functions, such as forming part of the windtunnel barrier and having mounting features.

Additional circuit boards may be used in the welding type system, and they may be partially potted as discussed above, fully potted, or not potted, as dictated by the design needs.

Numerous modifications may be made to the present disclosure which still fall within the intended scope hereof. Thus, it should be apparent that there has been provided a method and apparatus for providing welding type power with a partially potted circuit board that fully satisfies the objectives and advantages set forth above. Although the disclosure has been described specific embodiments thereof, it is evident that many alternatives, modifications and variations will be apparent to those skilled in the art. Accordingly, the invention is intended to embrace all such alternatives, modifications and variations that fall within the spirit and broad scope of the appended claims.

The embodiments of the invention in which an exclusive property or privilege is claimed are defined as follows:

1. A welding-type system comprising:
    an input circuit disposed to receive input power and to provide intermediate power;
    a power circuit, having a power control input and at least one switch responsive to the control input, and wherein the power circuit is disposed to receive intermediate power and provide welding type output power;
    a controller, having a set point input and a control output, wherein the control output is connected to the power control input;
    wherein a first subset of components from at least one of the power circuit, input circuit and controller are disposed on a first circuit board; wherein the adhesive is a different material from the potting compound, and wherein the power circuit further includes a second subset of components; and
    a potting barrier affixed to the first circuit board using at least an adhesive, and wherein the first subset of components are mounted on the circuit board within the potting barrier; and
    potting compound in the entire area within the potting barrier and on the circuit board.

2. The welding-type system of claim 1, wherein the potting barrier is further affixed to the circuit board using at least one mechanical fastener.

3. The welding-type system of claim 1, wherein the potting barrier is a rigid structure when affixed to the circuit board.

4. The welding-type system of claim 1, wherein the second subset of components are at least partially mounted on the first circuit board outside of the potting barrier.

5. The welding-type system of claim 4, wherein the input circuit and the power circuit are disposed inside a housing and the first circuit board is at least partially mounted inside an enclosed air flow space within the housing.

6. The welding-type system of claim 5, wherein the controller includes a third subset of components that are at least partially mounted outside of the enclosed airflow space.

7. The welding-type system of claim 6, wherein the power circuit includes a converter with at least one converter switch and a converter switch heat sink, wherein the converter switch heat sink is in the first subset of components.

8. The welding-type system of claim 1, wherein the potting barrier defines an area that is entirely potted without voids.

9. A partially potted circuit board for use in a welding-type system comprising:
    a circuit board;

a plurality of components mounted to the circuit board, wherein the plurality of components includes a first subset of components and a second subset of components;

a potting barrier affixed to the first circuit board using at least an adhesive, wherein the first subset of components are mounted on the circuit board within the potting barrier; and potting compound within the potting barrier and on the circuit board; wherein the adhesive is a different material from the potting compound.

10. The partially potted circuit board of claim 9, wherein the potting barrier is further affixed to the circuit board using at least one mechanical fastener.

11. The partially potted circuit board of claim 10, wherein the potting barrier is a rigid structure when affixed to the circuit board.

12. The partially potted circuit board of claim 11, wherein the second subset of components are at least partially mounted on the first circuit board outside of the potting barrier.

13. The partially potted circuit board of claim 12, wherein the welding type system includes a housing, and the partially potted circuit board is at least partially mounted inside an enclosed air flow space within the housing.

14. The partially potted circuit board of claim 9, wherein the potting barrier defines an area that is entirely potted without voids.

* * * * *